United States Patent
Zhu et al.

(10) Patent No.: US 11,983,415 B2
(45) Date of Patent: May 14, 2024

(54) MEMORY MANAGEMENT METHOD, MEMORY STORAGE DEVICE AND MEMORY CONTROL CIRCUIT UNIT

(71) Applicant: Hefei Core Storage Electronic Limited, Anhui Province (CN)

(72) Inventors: Qi-Ao Zhu, Anhui Province (CN); Chong Peng, Anhui Province (CN); Zhi Wang, Anhui Province (CN); Wan-Jun Hong, Anhui Province (CN)

(73) Assignee: Hefei Core Storage Electronic Limited, Anhui (CN)

( * ) Notice: Subject to any disclaimer, the term of this patent is extended or adjusted under 35 U.S.C. 154(b) by 91 days.

(21) Appl. No.: 16/554,645

(22) Filed: Aug. 29, 2019

(65) Prior Publication Data

US 2021/0011630 A1 Jan. 14, 2021

(30) Foreign Application Priority Data

Jul. 10, 2019 (CN) .......................... 201910618189.3

(51) Int. Cl.
  *G06F 12/00* (2006.01)
  *G06F 3/06* (2006.01)
  *G06F 13/16* (2006.01)
  *G11C 7/10* (2006.01)
  *G11C 11/56* (2006.01)

(52) U.S. Cl.
  CPC .......... *G06F 3/0617* (2013.01); *G06F 3/0659* (2013.01); *G06F 3/0679* (2013.01); *G06F 13/1689* (2013.01); *G11C 7/1051* (2013.01); *G11C 11/5642* (2013.01)

(58) Field of Classification Search
  CPC .... G06F 3/0604; G06F 3/0659; G06F 3/0679; G06F 3/0616; G06F 3/064
  USPC ....................................................... 711/154
  See application file for complete search history.

(56) References Cited

U.S. PATENT DOCUMENTS

| | | | | |
|---|---|---|---|---|
| 5,754,563 | A | * | 5/1998 | White ................ H03M 13/151 708/492 |
| 9,384,129 | B2 | * | 7/2016 | Basu .................... G06F 16/1727 |
| 9,430,114 | B1 | * | 8/2016 | Dingman ............... G06F 16/25 |
| 9,639,589 | B1 | * | 5/2017 | Theimer ................ G06F 21/00 |
| 9,953,693 | B2 | * | 4/2018 | Bains ..................... G06F 12/02 |

(Continued)

FOREIGN PATENT DOCUMENTS

| | | |
|---|---|---|
| CN | 104133779 | 11/2014 |
| CN | 102768853 | 7/2015 |

(Continued)

OTHER PUBLICATIONS

"Office Action of Taiwan Counterpart Application", issued on May 27, 2020, p. 1-p. 6.

(Continued)

*Primary Examiner* — Mohamed M Gebril

(74) *Attorney, Agent, or Firm* — JCIPRNET

(57) ABSTRACT

A memory management method for a memory storage device is provided. The memory management method includes: detecting effective information of at least one operation event performed by the memory storage device in a first mode; and adjusting a threshold value according to the effective information. The threshold value is configured to determine whether to instruct the memory storage device to enter the first mode.

9 Claims, 7 Drawing Sheets

(56) References Cited

U.S. PATENT DOCUMENTS

| | | | |
|---|---|---|---|
| 10,061,541 B1* | 8/2018 | Lee | G11C 11/40611 |
| 10,083,100 B1* | 9/2018 | Agetsuma | G06F 11/2094 |
| 10,447,267 B1* | 10/2019 | Waldrop | H03K 19/003 |
| 11,011,217 B1* | 5/2021 | Lee | G11C 11/40615 |
| 2006/0253496 A1* | 11/2006 | Hunter | G06F 16/80 |
| 2009/0327343 A1* | 12/2009 | McCormack | G06F 16/258 |
| 2012/0203951 A1* | 8/2012 | Wood | G11C 29/42 |
| | | | 711/E12.008 |
| 2012/0265907 A1* | 10/2012 | Oe | G06F 11/3485 |
| | | | 710/36 |
| 2014/0003178 A1* | 1/2014 | Song | G11C 11/40611 |
| | | | 365/222 |
| 2016/0034206 A1* | 2/2016 | Ryan | G06F 3/064 |
| | | | 711/103 |
| 2016/0188208 A1* | 6/2016 | Kim | G06F 3/0652 |
| | | | 711/103 |
| 2016/0371145 A1* | 12/2016 | Akutsu | G06F 3/067 |
| 2017/0024002 A1* | 1/2017 | Tzafrir | G06F 1/3228 |
| 2017/0220500 A1* | 8/2017 | Tong | G06F 13/36 |
| 2017/0293697 A1* | 10/2017 | Youshi | G06F 16/84 |
| 2019/0041957 A1* | 2/2019 | Hunt | G06F 1/324 |
| 2019/0310925 A1* | 10/2019 | Yoshida | G06F 3/065 |
| 2020/0073591 A1* | 3/2020 | Tsai | G06F 3/0604 |
| 2020/0210291 A1* | 7/2020 | Yamamoto | G06F 11/1076 |
| 2021/0255805 A1* | 8/2021 | Harata | H04L 12/403 |
| 2022/0350510 A1* | 11/2022 | Tsukioka | G06F 11/2089 |

FOREIGN PATENT DOCUMENTS

| | | |
|---|---|---|
| CN | 105589811 | 5/2016 |
| CN | 105786717 | 11/2018 |
| CN | 109947355 | 6/2019 |
| TW | I260498 | 8/2006 |

OTHER PUBLICATIONS

"Office Action of China Counterpart Application", issued on Oct. 18, 2022, p. 1-p. 11.

* cited by examiner

MEMORY MANAGEMENT METHOD, MEMORY STORAGE DEVICE AND MEMORY CONTROL CIRCUIT UNIT

CROSS-REFERENCE TO RELATED APPLICATION

This application claims the priority benefit of China application serial no. 201910618189.3, filed on Jul. 10, 2019. The entirety of the above-mentioned patent application is hereby incorporated by reference herein and made a part of this specification.

BACKGROUND

Technical Field

The disclosure relates to a memory management technique, and particularly relates to a memory management method, a memory storage device and a memory control circuit unit.

Description of Related Art

Digital cameras, cell phones, and MP3 players have undergone rapid growth in recent years, so that consumer demands for storage media have also rapidly increased. Since a rewritable non-volatile memory module (for example, a flash memory) has characteristics of data non-volatility, low power consumption, small volume, non-mechanical structure, etc., it is very suitable for being built in the various portable multimedia devices mentioned above.

Generally, when the memory storage device is idle for a fixed period of time, the memory storage device may enter a background mode (which is also referred to as an idle mode) to save power and/or execute some background operations, for example, to execute a garbage collection operation for releasing spare physical units, etc. Moreover, after entering the background mode, if an instruction from a host system is received, the memory storage device may immediately leave the background mode and enter a normal mode, so as to execute the instruction sent by the host system in the normal mode. However, a time parameter used for determining whether to enter the background mode is generally predetermined. For the memory storage devices of different purposes or users with different operating habits, the predetermined time parameter may probably cause frequent switch of the memory storage device between the background mode and the normal mode, which wastes system performance unnecessarily. Alternatively, in some cases, to enter the background mode too late may also increase unnecessary power consumption.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure is directed to a memory management method, a memory storage device and a memory control circuit unit, which are adapted to mitigate the aforementioned problem.

An exemplary embodiment of the disclosure provides a memory management method adapted to a memory storage device. The memory management method includes: detecting effective information of at least one operation event executed by the memory storage device in a first mode; and adjusting a threshold value according to the effective information. The threshold value is configured to determine whether to instruct the memory storage device to enter the first mode.

An exemplary embodiment of the disclosure provides a memory storage device including a connection interface unit, a rewritable non-volatile memory module and a memory control circuit unit. The connection interface unit is coupled to a host system. The memory control circuit unit is coupled to the connection interface unit and the rewritable non-volatile memory module. The memory control circuit unit is configured to detect effective information of at least one operation event executed by the memory storage device in a first mode, and the memory control circuit unit is further configured to adjust a threshold value according to the effective information. The threshold value is configured to determine whether to instruct the memory storage device to enter the first mode.

An exemplary embodiment of the disclosure provides a memory control circuit unit, which is adapted to control a memory storage device including a rewritable non-volatile memory module. The memory control circuit unit includes a host interface, a memory interface and a memory management circuit. The host interface is coupled to a host system. The memory interface is coupled to the rewritable non-volatile memory module. The memory management circuit is coupled to the host interface and the memory interface. The memory management circuit is configured to detect effective information of at least one operation event executed by the memory storage device in a first mode, and the memory management circuit is further configured to adjust a threshold value according to the effective information. The threshold value is configured to determine whether to instruct the memory storage device to enter the first mode.

According to the above description, in the first mode, the effective information of at least one operation event being executed by the memory storage device is detected. According to the effective information, a threshold value used for determining whether to instruct the memory storage device to enter the first mode may be adjusted. For example, after at least one adjustment to the threshold value, the threshold may be adjusted to an optimal customized value. Based on such customized value, the memory storage device may have a better balance between power saving and system performance.

It should be understood, however, that this Summary may not contain all of the aspects and embodiments of the present disclosure, is not meant to be limiting or restrictive in any manner, and that the present disclosure as disclosed herein is and will be understood by those of ordinary skill in the art to encompass obvious improvements and modifications thereto.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
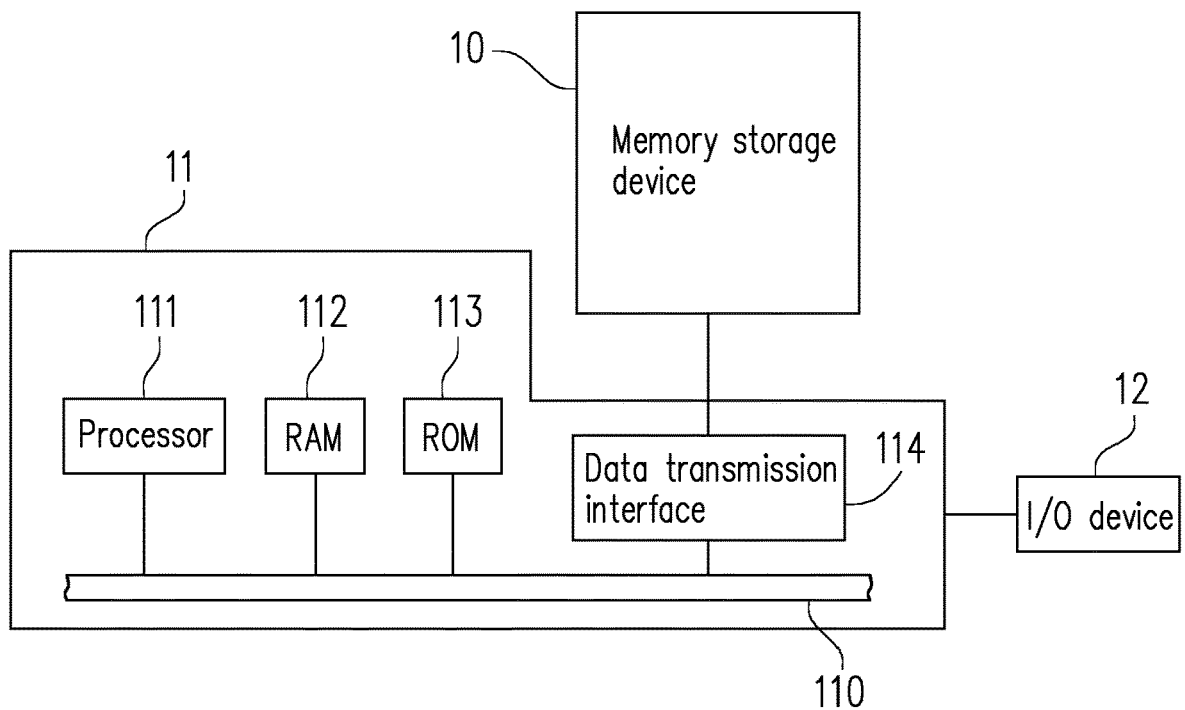
FIG. 1 is a schematic diagram of a host system, a memory storage device and an input/output (I/O) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (which is also referred to as a memory storage system) includes a rewritable non-volatile memory module and a controller (which is also referred to as a control circuit). The memory storage device is generally used together with a host system, and the host system may write data into the memory storage device or read data from the memory storage device.

Figure 2:
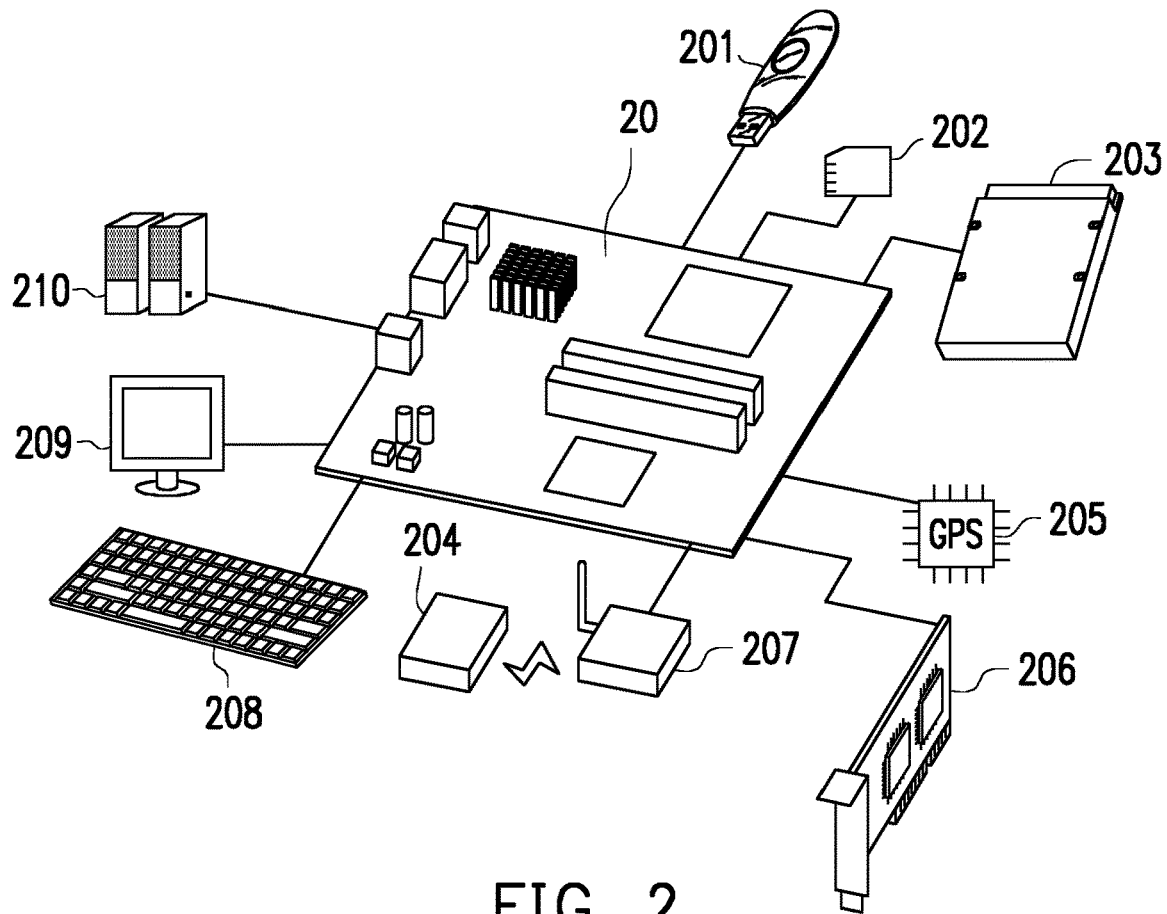
FIG. 2 is a schematic diagram of a host system, a memory storage device and an I/O device according to another exemplary embodiment of the disclosure.

FIG. 1 is a schematic diagram of a host system, a memory storage device and an input/output (I/O) device according to an exemplary embodiment of the disclosure. FIG. 2 is a schematic diagram of a host system, a memory storage device and an I/O device according to another exemplary embodiment of the disclosure.

Referring to FIG. 1 and FIG. 2, the host system 11 generally includes a processor 111, a Random Access Memory (RAM) 112, a Read Only Memory (ROM) 113 and a data transmission interface 114. The processor 111, the RAM 112, the ROM 113 and the data transmission interface 114 are all coupled to a system bus 110.

In the exemplary embodiment, the host system 11 is coupled to the memory storage device 10 through the data transmission interface 114. For example, the host system 11 may storage data to the memory storage device 10 or read data from the memory storage device 10 through the data transmission interface 114. Moreover, the host system 10 is coupled to the I/O device 12 through the system bus 110. For example, the host system 11 may transmit an output signal to the I/O device 12 or receive an input signal from the I/O device 12 through the system bus 110.

In the exemplary embodiment, the processor 111, the RAM 112, the ROM 113 and the data transmission interface 114 may be disposed on a motherboard 20 of the host system 11. The number of the data transmission interface 114 may be one or plural. The motherboard 20 may be coupled to the memory storage device 10 in a wired or wireless manner through the data transmission interface 114. The memory storage device 10 is, for example, a flash drive 201, a memory card 202, a Solid State Drive (SSD) 203 or a wireless memory storage device 204. The wireless memory storage device 204 is, for example, a memory storage device based on various wireless communication techniques, such as a Near Field Communication (NFC) memory storage device, a WiFi memory storage device, a Bluetooth memory storage device or a low power consumption Bluetooth memory storage device (for example, iBeacon), etc. Moreover, the motherboard 20 may also be coupled to various I/O devices such as a Global Positioning System (GPS) module 205, a network interface card 206, a wireless transmission interface 207, a keyboard 208, a screen 209, a loudspeaker 210, etc., though the system bus 110. For example, in an exemplary embodiment, the motherboard 20 may access the wireless memory storage device 204 though the wireless transmission device 207.

Figure 3:
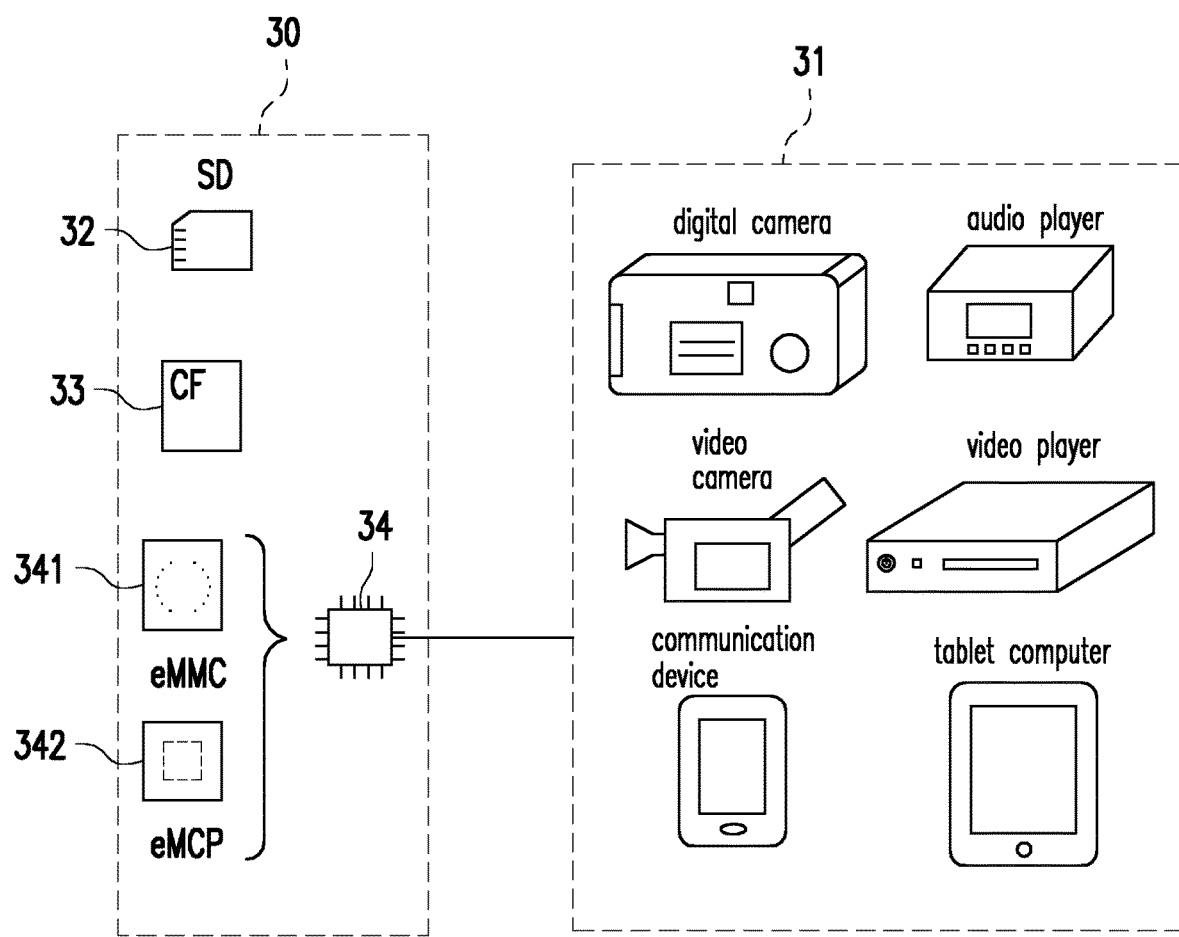
FIG. 3 is a schematic diagram of a host system and a memory storage device according to another exemplary embodiment of the disclosure.

In an exemplary embodiment, the aforementioned host system may be any system that may substantially cooperate with the memory storage device to store data. In the aforementioned exemplary embodiment, the host system implemented by a computer system is taken as an example for description, but FIG. 3 is a schematic diagram of a host system and a memory storage device according to another exemplary embodiment of the disclosure. Referring to FIG. 3, in another exemplary embodiment, the host system 31 may also be a digital camera, a video camera, a communication device, an audio player, a video player or a tablet computer, etc., and the memory storage device 30 may be various non-volatile memory storage device such as a Secure Digital (SD) card 32, a Compact Flash (CF) card 33 or an embedded storage device 34, etc., used by the host system 31. The embedded storage device 34 includes various types of embedded storage device that directly couple a memory module to a substrate of the host system, such as an embedded Multi Media Card (eMMC) 341 and/or an embedded Multi Chip Package (eMCP) storage device 342, etc.

Figure 4:
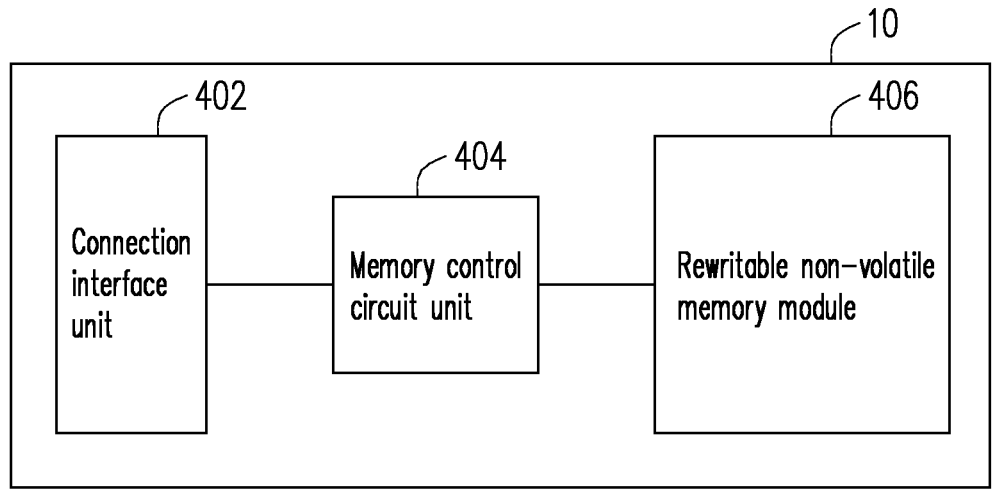
FIG. 4 is a schematic block diagram of a memory storage device according to an exemplary embodiment of the disclosure.

FIG. 4 is a schematic block diagram of a memory storage device according to an exemplary embodiment of the disclosure. Referring to FIG. 4, the memory storage device 10 includes a connection interface unit 402, a memory control circuit unit 404 and a rewritable non-volatile memory module 406.

The connection interface unit 402 is configured to couple the memory storage device 10 to the host system 11. The memory storage device 10 may communicate with the host system 11 through the connection interface unit 402. In the exemplary embodiment, the connection interface unit 402 is complied with a Serial Advanced Technology Attachment (SATA) standard. However, it should be noted that the disclosure is not limited thereto, and the connection interface unit 402 may also be complied with a Parallel Advanced Technology Attachment (PATA) standard, an Institute of Electrical and Electronic Engineers (IEEE) 1394 standard, a Peripheral Component Interconnect Express (PCI express) standard, a Universal Serial Bus (USB) standard, an SD interface standard, an Ultra High Speed-I (UHS-I) interface standard, an Ultra High Speed-II (UHS-II) interface standard, a Memory Stick (MS) interface standard, an MCP interface standard, an MMC interface standard, an eMMC interface standard, a Universal Flash Storage (UFS) interface standard, an eMCP interface standard, a CF interface standard, an Integrated Device Electronics (IDE) interface standard or other suitable standards. The connection interface unit 402 and the memory control circuit unit 404 may be packaged in a same chip, or the connection interface unit 402 is disposed outside a chip containing the memory control circuit unit 404.

The memory control circuit unit 404 is configured to execute a plurality of logic gates or control instructions implemented in a hardware form or a firmware form, and may perform a writing operation, a reading operation or an erasing operation on the rewritable non-volatile memory module 406 according to instructions of the host system 11.

The rewriteable non-volatile memory module 406 is coupled to the memory control circuit unit 404 and is used for storing data written by the host system 11. The rewriteable non-volatile memory module 406 can be a Single Level Cell (SLC) NAND flash memory module (i.e., a flash memory module with one memory cell storing data of one bit), a Multi Level Cell (MLC) NAND flash memory module (i.e., a flash memory module with one memory cell storing data of two bits), a Triple Level Cell (TLC) NAND flash memory module (i.e., a flash memory module with one memory cell storing data of three bits), a Quad Level Cell (QLC) NAND flash memory module (i.e., a flash memory module with one memory cell storing data of four bits), other flash memory modules or other memory modules having the same characteristic.

Each of the memory cells of the rewriteable non-volatile memory module 406 stores one or a plurality of bits through changing of a voltage (which is also referred to as a threshold voltage hereinafter). To be specific, a charge trapping layer is provided between a control gate and a channel of each memory cell. By applying a writing voltage to the control gate, an amount of electrons of the charge trapping layer may be changed, so as to change the threshold voltage of the memory cell. The operation of changing the threshold voltage of the memory cell is referred to as "writing data into the memory cell" or "programming the memory cell". Along with the change of the threshold voltage, each memory cell of the rewriteable non-volatile memory module 406 has a plurality of storage states. By applying a reading voltage, the storage state of a certain memory cell may be determined, so as to obtain one or a plurality of bits stored in the memory cell.

In the exemplary embodiment, the memory cells of the rewritable non-volatile memory module 406 may construct a plurality of physical programming units, and the physical programming units may construct a plurality of physical erasing unit. To be specific, the memory cells on the same word line may consist one or a plurality of physical programming units. If one memory cell may store two or more bits, the physical programming units on the same word line may be at least categorized into a lower physical programming unit and an upper physical programming unit. For example, a Least Significant Bit (LSB) of one memory cell belongs to the lower physical programming unit, and a Most Significant Bit (MSB) of one memory cell belongs to the upper physical programming unit. Generally, in an MLC NAND flash memory, a writing speed of the lower physical programming unit is faster than that of the upper physical programming unit, and/or reliability of the lower physical programming unit is higher than that of the upper physical programming unit.

In the exemplary embodiment, physical programming unit is the smallest unit for programming data. Namely, physical programming unit is the smallest unit for writing data. For example, the physical programming unit is a physical page or a physical sector. If the physical programming unit is physical page, the physical programming unit may include a data bit area and a redundant bit area. The data bit area includes a plurality of physical sectors and is configured for storing user data, and the redundant bit area is configured for storing system data (for example, management data of Error Checking and Correcting (ECC) codes, etc.). In the exemplary embodiment, each data bit area includes 32 physical sectors, and the size of one physical sector is 512 bytes (B). However, in other exemplary embodiments, the data bit area may also include 8, 16 or more or less physical sectors, and the size of each physical sector can be larger or smaller. On the other hand, physical erasing unit is the smallest unit for erasing data. Namely, each physical erasing unit contains the least number of memory cells that are erased all together. For example, the physical erasing unit is a physical block.

Figure 5:
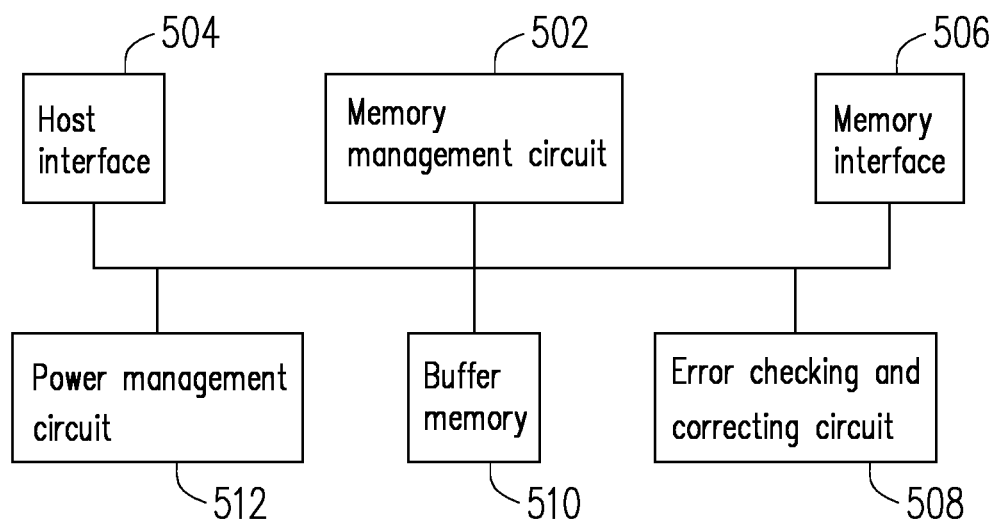
FIG. 5 is a schematic block diagram of a memory control circuit unit according to an exemplary embodiment of the disclosure.

FIG. 5 is a schematic block diagram of a memory control circuit unit according to an exemplary embodiment of the disclosure. Referring to FIG. 5, the memory control circuit unit 404 includes a memory management circuit 502, a host interface 504 and a memory interface 506.

The memory management circuit 502 is configured to control a whole operation of the memory control circuit unit 404. To be specific, the memory management circuit 502 has a plurality of control instructions, and when the memory storage device 10 operates, the control instructions are executed to perform a write operation, a read operation and an erase operation, etc. The operation of the memory management circuit 502 is described below, which is equivalent to describe the operation of the memory control circuit unit 404.

In the exemplary embodiment, the control instructions of the memory management circuit 202 are implemented in a firmware form. For example, the memory management circuit 202 has a microprocessor unit (not shown) and a read-only memory (not shown), and the control instructions are burned into the read-only memory. When the memory storage device 10 operates, the control instructions are executed by the microprocessor unit to perform a write operation, a read operation and an erase operation, etc.

In another exemplary embodiment of the disclosure, the control instructions of the memory management circuit 502 may also be stored in a specific area (a system area in the memory module used for storing system data) of the rewritable non-volatile memory module 506 in form of program codes. Moreover, the memory management circuit 502 has a microprocessor unit (not shown), a read-only memory (not shown) and a random access memory (not shown). Particularly, the read-only memory has a boot code, and when the memory control circuit unit 404 is enabled, the microprocessor unit first executes the boot code to load the control instructions stored in the rewritable non-volatile memory module 406 to the random access memory of the memory management circuit 502. Then, the microprocessor unit executes the control instructions to perform a write operation, a read operation and an erase operation, etc.

Moreover, in another exemplary embodiment, the control instructions of the memory management circuit 502 may be implemented in a hardware form. For example, the memory management circuit 502 includes a micro controller, a memory management circuit, a memory writing circuit, a memory reading circuit, a memory erasing circuit and a data processing circuit. The memory management circuit, the memory writing circuit, the memory reading circuit, the memory erasing circuit and the data processing circuit are coupled to the micro controller. The memory management circuit is configured to manage memory cells or memory cell groups of the rewritable non-volatile memory module 406. The memory writing circuit is configured to send a write instruction series to the rewritable non-volatile memory module 406 to write data into the rewritable non-volatile memory module 406. The memory reading circuit is configured to send a read instruction series to the rewritable non-volatile memory module 406 to read data from the rewritable non-volatile memory module 406. The memory erasing circuit is configured to send an erase instruction series to the rewritable non-volatile memory module 406 to erase data in the rewritable non-volatile memory module 406. The data processing circuit is configured to process data to be written to the rewritable non-volatile memory module 406 or data to be read from the rewritable non-volatile memory module 406. The write instruction series, the read instruction series, the erase instruction series may respectively include one or a plurality of program codes or instruction codes, and are configured to instruct the rewritable non-volatile memory module 406 to execute the corresponding write operation, read operation and erase operation, etc. In an exemplary embodiment, the memory management circuit 502 may further send other types of instruction series to the rewritable non-volatile memory module 406 to execute corresponding operations.

The host interface 504 is coupled to the memory management circuit 502. The memory management circuit 502 may communicate with the host system 11 through the host interface 504. The host interface 504 is configured to receive and identify instructions and data transmitted by the host system 11. For example, the instructions and data transmitted by the host system 11 may be transmitted to the memory management circuit 502 through the host interface 504. Moreover, the memory management circuit 502 may transmit data to the host system 11 through the host interface 504. In the exemplary embodiment, the host interface 504 is complied with the SATA standard. However, it should be noticed that the disclosure is not limited thereto, and the host interface 504 may also be complied with the PATA standard, the IEEE 1394 standard, the PCI express standard, the USB standard, the SD standard, the UHS-I standard, the UHS-II standard, the MS standard, the MMC standard, the eMMC standard, the UFS standard, the CF standard, the IDE standard or other suitable data transmission standard.

The memory interface 506 is coupled to the memory management circuit 502, and is configured to access the rewritable non-volatile memory module 406. Namely, data to be written into the rewritable non-volatile memory module 406 is transformed into a format that may be accepted by the rewritable non-volatile memory module 406 through the memory interface 506. To be specific, when the memory management circuit 502 wants to access the rewritable non-volatile memory module 406, the memory interface 506 may transmit a corresponding instruction series. For example, the instruction series may include a write instruction series instructing to write data, a read instruction series instructing to read data, an erase instruction series instructing to erase data, and corresponding instruction series instructing various memory operations (for example, to change a read voltage level or execute a garbage collection operation, etc.). These instruction series are, for example, generated by the memory management circuit 502, and transmitted to the rewritable non-volatile memory module 406 through the memory interface 506. These instruction series may include one or a plurality of signals, or data on the bus. These signals or data may include instruction codes or program codes. For example, the read instruction series may include a read identification code, a memory address and other information.

In an exemplary embodiment, the memory control circuit unit 404 further includes an error checking and correcting circuit 508, a buffer memory 510, and a power management circuit 512.

The error checking and correcting circuit 508 is coupled to the memory management circuit 502, and is configured to execute an error checking and correcting operation to ensure correctness of data. To be specific, when the memory management circuit 502 receives a write instruction from the host system 11, the error checking and correcting circuit 508 generates a corresponding Error Correcting Code (ECC) and/or an Error Detecting Code (EDC) for data corresponding to the write instruction, and the memory management circuit 502 writes the data corresponding to the write instruction and the corresponding ECC and/or the EDC to the rewritable non-volatile memory module 406. Then, when the memory management circuit 502 reads data from the rewritable non-volatile memory module 406, the memory management circuit 502 simultaneously reads the ECC and/or EDC corresponding to the data, and the error checking and correcting circuit 508 performs the error checking and correcting operation on the read data according to the ECC and/or EDC.

The buffer memory 510 is coupled to the memory management circuit 502 and is configured to temporarily store data or instructions coming from the host system 11 or data coming from the rewritable non-volatile memory module 406. The power management circuit 512 is coupled to the memory management circuit 502, and is configured control a power of the memory storage device 10.

In an exemplary embodiment, the rewritable non-volatile memory module 406 of FIG. 4 may also be referred to as a flash memory module, and the memory control circuit unit 404 is also referred to as a flash memory controller used for controlling the flash memory module. In an exemplary embodiment, the memory management circuit 502 of FIG. 5 may also be referred to as a flash memory management circuit.

Figure 6:
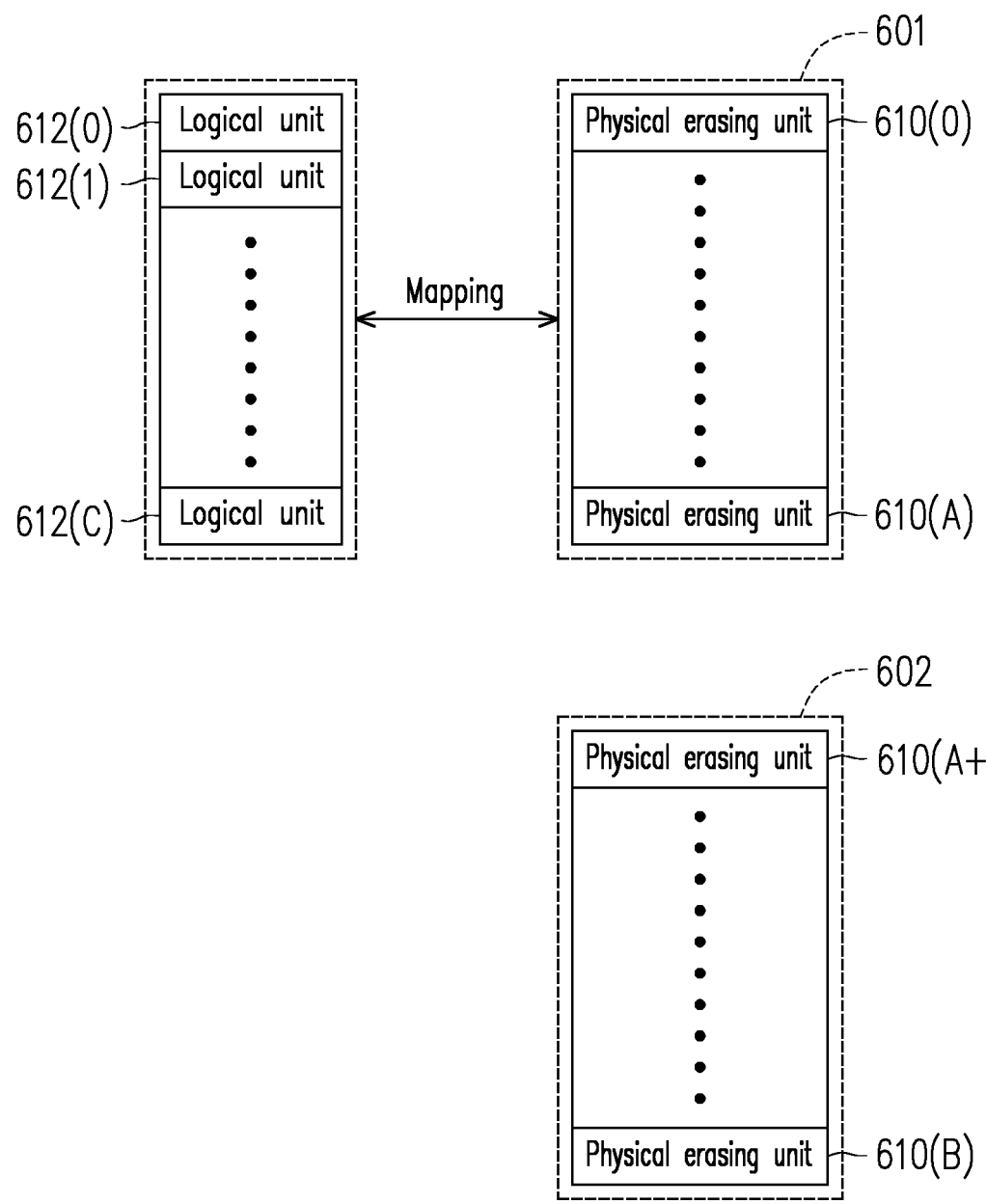
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure. Referring to FIG. 6, the memory management circuit 502 may logically group physical units 610(0)-610(B) of the rewritable non-volatile memory module 406 into a storage area 601 and a replacement area 602. The physical units 610(0)-610(A) in the storage area 601 are used for storage data, and the physical units 610(A+1)-610(B) in the replacement area 602 are used for replacing damaged physical units in the storage area 601. For example, if data read from a certain physical unit contains too many errors that cannot be corrected, such physical unit is regarded as a damaged physical unit. It should be noted that if there is no available physical erase units in the replacement area 602, the memory management circuit 502 may probably declare the entire memory storage device 10 as a write protect state that cannot be written with data.

In the exemplary embodiment, each physical unit refers to a physical erase unit. However, in another exemplary embodiment, one physical unit may also refer to one physical address, one physical programming unit or consist of a plurality of consecutive or non-consecutive physical addresses. The memory management circuit 502 may configure logical units 612(0)-612(C) to map the physical units 610(0)-610(A) in the storage unit 601. In the exemplary embodiment, each logical unit refers to one logical address. However, in another exemplary embodiment, one logical unit may also refer to one logical programming unit, one logical erase unit or consist of a plurality of consecutive or non-consecutive logical addresses. Moreover, each of the logical units 612(0)-612(C) may be mapped to one or a plurality of physical units.

The memory management circuit 502 records a mapping relationship (which is also referred to as a logical-physical address mapping relationship) between the logical units and the physical units to at least one logical-physical address mapping table. When the host system 11 wants to read data from the memory storage device 10 or write data into the memory storage device 10, the memory management circuit 502 may execute a data access operation of the memory storage device 10 according to the logical-physical address mapping table.

It is noted that in the following description, some terms may be replaced with corresponding abbreviations for ease of reading (see Table 1).

TABLE 1

| | |
|---|---|
| rewritable non-volatile memory module | RNVM module |
| memory management circuit | MMC |
| memory storage device | MSD |
| effective information | EI |

Under a predetermined condition, the MSD 10 is operated in a normal mode. In the normal mode, the MMC 502 may receive an instruction from the host system 11 to execute a data read, write or erase operation. For example, according to a read instruction coming from the host system 11, the MMC 502 may read data required by the host system 11 from the RNVM module 406. Alternatively, according to a write instruction coming from the host system 11, the MMC 502 may write data coming from the host system 11 to the RNVM module 406. Alternatively, according to an erase instruction coming from the host system 11, the MMC 502 may erase data instructed by the host system 11 from the RNVM module 406.

Under some situations, the MMC 502 may instructs the MSD 10 to enter a background mode. In the background mode, the MMC 502 may execute a background operation. Generally, the background operation does not include operations executed under instruction of the host system 11. For example, the background operation may include various management operations executed by the MMC 502, such as a data merge operation (which is also referred to as a garbage collection operation) used for releasing spare physical units, a wear levelling operation used for prolonging a service life of the MSD 10 and/or a table update operation used for updating system information (or management information), etc. Moreover, after entering the background mode, the MMC 502 may instruct the MSD 10 to leave the background mode to enter a normal mode, so as to process instructions coming from the host system 11.

In an exemplary embodiment, one background operation may correspond to at least one operation event. The data merge operation may include at least one table read event, at least one data extraction event and at least one data write event of the RNVM module 406. The table read event is configured to read management information (for example, mapping information recorded by the logical-physical address mapping table) from the RNVM module 406. The data extraction event is configured to collect effective data from the physical unit serving as a source node according to the read management information. The data write event is configured to write the collected effective data to the physical unit serving as a target node. The wear levelling operation may include a data read event and a data write event for moving data between physical units of different wear levels. The table update operation may include a data write event of updating a specific management table (for example, the logical-physical address mapping table) in the RNVM module 406 according to data in the buffer memory 510. Moreover, in actual practice, the background operation may further include other types of events executed by the MMC 502 in the background mode, which are not described one-by-one.

After entering the background mode, the MMC 502 may instruct the RNVM module 406 to execute one or a plurality of operation events of the background operation. One operation event may be successfully executed or failed. For example, in an exemplary embodiment, after entering the background mode, the MMC 502 may instruct the RNVM module 406 to execute a table read event. Before the MSD 10 leaves the background mode, if execution of the table read event is completed, the table read event may be regarded as a successfully executed event. However, in another exemplary embodiment, if the MSD 10 is instructed to leave the background mode before the execution of the table read event is completed, the uncompleted table read event is regarded as a failed event (or an event that is not successfully executed).

Figure 7:
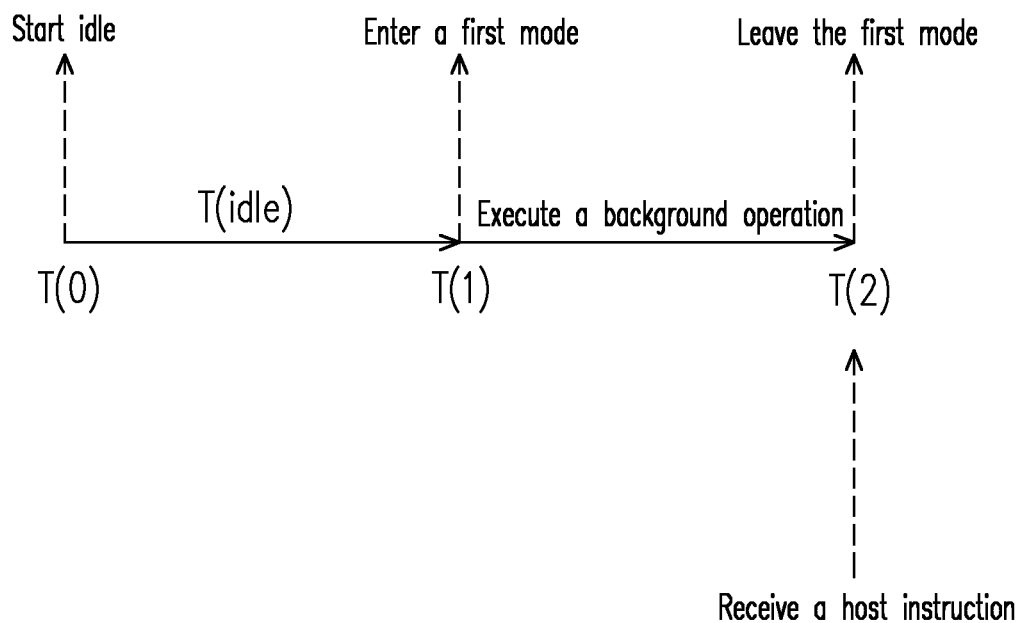
FIG. 7 is a schematic diagram of controlling an operation mode of the memory storage device according to an exemplary embodiment of the disclosure.

FIG. 7 is a schematic diagram of controlling an operation mode of the MSD according to an exemplary embodiment of the disclosure. In the following exemplary embodiment, for simplicity's sake, the background mode is referred to as a first mode, and the normal mode is referred to as a second mode. Referring to FIG. 7, it is assumed that the current MSD 10 is operated in the second mode (i.e. the normal mode). In the second mode, the MMC 502 may count time information T(idle). The time information T(idle) reflects an idle time of the MSD 10 in the second mode.

In the exemplary embodiment, it is assumed that at a time point T(0), the RNVM module 406 completes an operation instructed by a last instruction coming from the host system 11. Therefore, at the time point T(0), the MSD 10 starts to be idle. In response to the MSD 10 starting to be idle, the MMC 502 may start counting the time information T(idle) from the time point T(0). The MMC 502 may continuously determine whether the time information T(idle) satisfies a threshold value THR. For example, the MMC 502 may determine whether a time length corresponding to the time information T(idle) is equal to (or greater than) the threshold value THR. If the time length corresponding to the time information T(idle) is equal to (or greater than) the threshold value THR, the MMC 502 determines that the time information T(idle) satisfies the threshold value THR. However, if the time length corresponding to the time information T(idle) is smaller than the threshold value THR, the MMC 502 determines that the time information T(idle) does not satisfy the threshold value THR.

In the exemplary embodiment, it is assumed that at a time point T(1), the MMC 502 determines that the time information T(idle) satisfies the threshold value THR. Therefore, after the time point T(1), the MMC 502 instructs the MSD 10 to enter the first mode (i.e. the background mode). After entering the first mode, it is assumed that at a time point T(2), the MMC 502 receives a new instruction (for example, a write instruction) from the host system 11. In response to the new instruction, after the time point T(2), the MMC 502 may instruct the MSD 10 to leave the first mode and enter the second mode. In the second mode, the MMC 502 may instruct the RNVM module 406 to execute an operation (for example, a write operation) instructed by the new instruction. Moreover, in the background mode (i.e. between the time points T(1) and T(2)), the MMC 502 may instruct the RNVM module 406 to execute at least one operation event of the background operation.

It should be noted that in the exemplary embodiment of FIG. 7, the time point of entering the first mode (i.e. the time point T(1)) is determined by the MMC 502, and the time point of leaving the first mode (i.e. the time point T(2)) is determined by a time point of receiving a next host instruction. In other words, the MMC 502 (only) has control over decision of the time point T(1) in FIG. 7, and does not have control over the decision of the time point T(2).

In an exemplary embodiment, each switching of the operation mode of the MSD 10 may result in additional system power consumption. Therefore, in the background mode (for example, between the time points T(1) and T(2)), the greater the proportion of the total number of the successfully executed events in all executed events is, the more worthwhile the additional system power consumed for entering and leaving the first mode is. Conversely, in the background mode (for example, between the time points T(1) and T(2)), the smaller the proportion of the total number of the successfully executed events in all executed events is, the less worthwhile the additional system power consumed for entering and leaving the first mode is. The greater the proportion of the total number of the successfully executed events in all executed events is, the better balance between the additional system power consumption and the successfully executed operation events is achieved, so as improve the system performance of the MSD 10.

In an exemplary embodiment, the MMC 502 may detect EI of at least one operation event executed by the MSD 10 in the first mode. For example, the EI may reflect a success rate of executing the at least one operation event in the first mode. According to the EI, the MMC 502 may dynamically adjust the threshold value THR used for determining whether to instruct the MSD 10 to enter the first mode.

In an exemplary embodiment, the MMC 502 may obtain a total number (which is also referred to as a first total number) of first type events in all operation events executed in the first mode, and obtain a total number (which is also referred to as a second total number) of second type events in all operation events executed in the first mode. For example, the first type events may be successfully executed operation events, and the second type events may be failed operation events. The MMC 502 may obtain the EI according to the first total number and the second total number. For example, the MMC 502 may obtain the EI according to a following equation (1):

$$EI=CS/(CS+CF) \qquad (1)$$

In the equation (1), EI represents the EI, CS represents the first total number (i.e. the total number of the successfully executed operation events), and CF represents the second total number (i.e. the total number of the failed operation events). It should be noted that the equation (1) may be further added with other logical operations or replaced by a logical operation of the similar function, which is not limited by the disclosure.

In an exemplary embodiment, the MMC 502 may determine whether the obtained EI is complied with a specific condition and adjust or not to adjust the threshold value THR according to a determination result. In an exemplary embodiment, the MMC 502 may determine whether the obtained EI is complied with a certain condition (which is also referred to as a first condition). For example, the MMC 502 may determine whether a value of the obtained EI is smaller than an evaluation value (which is also referred to as a first evaluation value). In an exemplary embodiment, the first evaluation value may be 0.9 (i.e. 90%) or other value between 0 and 1. If the value of the obtained EI is smaller than the first evaluation value, the MMC 502 determines that the obtained EI is complied with the first condition. If the obtained EI is complied with the first condition, the MMC 502 may increase the threshold value THR. For example, the MMC 502 may increase the currently used threshold value THR by an adjustment value ΔV1, so as to dynamically update the threshold value THR for the next use.

In an exemplary embodiment, if the value of the obtained EI is not smaller than the first evaluation value, the MMC 502 may further determine whether the value of the obtained EI is greater than or equal to another evaluation value (which is also referred to as a second evaluation value). In an exemplary embodiment, the second evaluation value may be 1 (i.e. 100%) or other value between 0 and 1, and the second evaluation value may be greater than the first evaluation value. If the value of the obtained EI is greater than or equal to the second evaluation value, the MMC 502 determines that the obtained EI is complied with a second condition. If the obtained EI is complied with the second condition, the MMC 502 may decrease the threshold value THR. For example, the MMC 502 may decrease the currently used threshold value THR by an adjustment value ΔV2, so as to dynamically update the threshold value THR for the next use.

In an exemplary embodiment, if the value of the obtained EI is between the first evaluation value and the second evaluation value, the MMC 502 may determine that the obtained EI is complied with a third condition. If the obtained EI is complied with the third condition, the MMC 502 may temporarily not adjust the currently used threshold value THR.

Taking FIG. 7 as an example, by evaluating the EI of the operation events executed in the first mode in the past and dynamically adjusting the threshold value THR for determining whether to enter the first mode in a next time according to an evaluation result, the time point T(1) for entering the first mode next time may be optimized according to operating habits or characteristics of the host system 11.

In an exemplary embodiment, the EI obtained through each entry and departure from the first mode may be directly applied to update the threshold value THR for the next use.

However, the disclosure is not limited thereto. In another exemplary embodiment, the EI obtained through multiple entries and departures from the first mode may be evaluated as a whole to update the threshold value THR. For example, in multiple entries of the first mode, the total number of the successfully executed operation events and the total number of the failed operation events may be counted, and the corresponding EI may be obtained through the equation (1) or a similar algorithm. The EI may also be used for updating the threshold value THR used in later determination of whether to enter the first mode.

In an exemplary embodiment of FIG. 7, a time interval between the time point T(1) and the time point T(2) may also be divided into a plurality of sub-time intervals. Within each of the sub-time intervals, the total number of the successfully executed operation events and the total number of the failed operation events may be counted and the corresponding EI is obtained through the equation (1) or the similar algorithm. Such EI may also be used for updating the threshold value THR used in later determination of whether to enter the first mode.

In an exemplary embodiment, the power consumption of the MSD 10 in the first mode is lower than that of the MSD 10 in the second mode. In an exemplary embodiment, a system performance of the MSD 10 in the first mode is lower than that of the MSD 10 in the second mode. In an exemplary embodiment, the first mode is also referred to as a power-saving mode.

Figure 8:
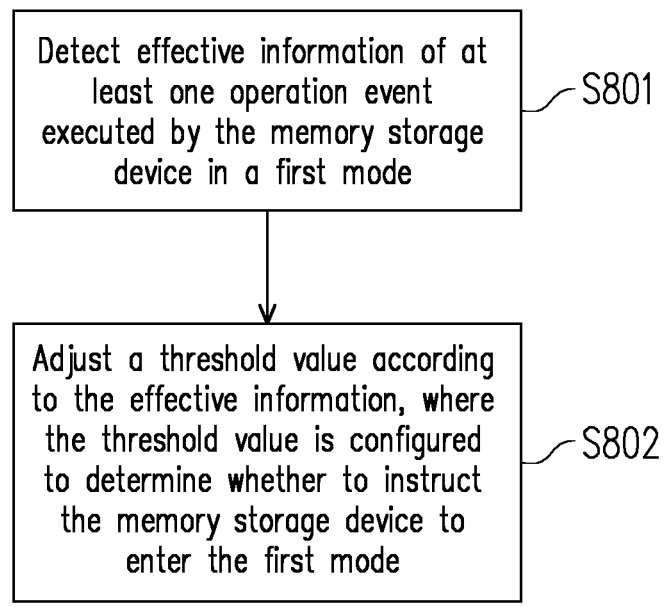
FIG. 8 is a flowchart illustrating a memory management method according to an exemplary embodiment of the disclosure.

FIG. 8 is a flowchart illustrating a memory management method according to an exemplary embodiment of the disclosure. Referring to FIG. 8, in a step S801, in a first mode, EI of at least one operation event executed by the MSD is detected. In a step S802, a threshold value is adjusted according to the EI, where the threshold value is configured to determine whether to instruct the MSD to enter the first mode.

Figure 9:
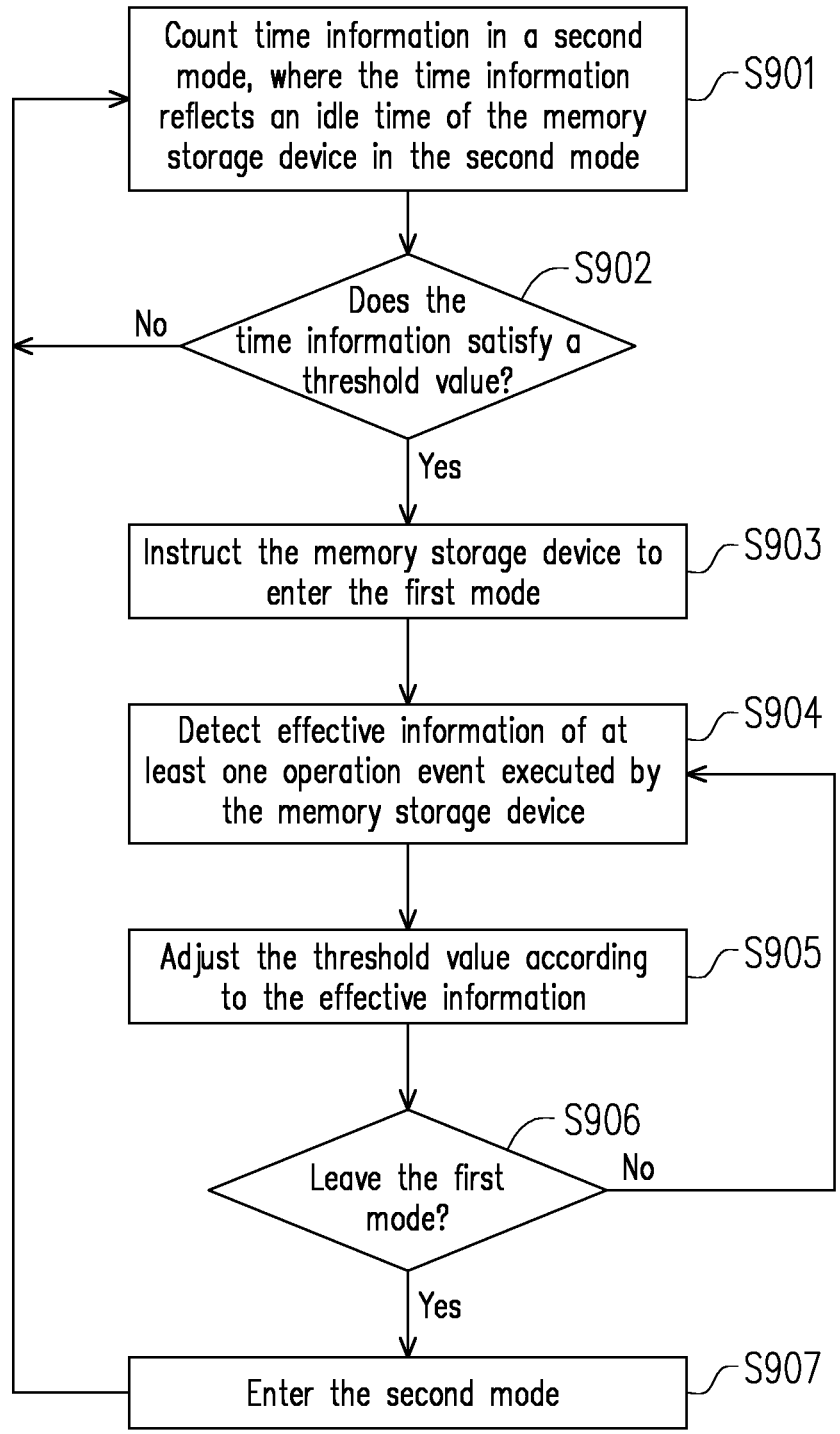
FIG. 9 is a flowchart illustrating a memory management method according to an exemplary embodiment of the disclosure.

FIG. 9 is a flowchart illustrating a memory management method according to an exemplary embodiment of the disclosure. Referring to FIG. 9, in a step S901, time information is counted in a second mode, where the time information reflects an idle time of the MSD in the second mode. In a step S902, it is determined whether the time information satisfies a threshold value. The threshold value is used for determining whether to instruct the MSD to enter the first mode. If the time information does not satisfy the threshold value, the flow may return to the step S901. If the time information satisfies the threshold value, in a step S903, the MSD is instructed to enter the first mode.

In a step S904, EI of at least one operation event executed by the MSD in the first mode is detected. In a step S905, the threshold value is adjusted according to the EI. In a step S906, it is determined whether the MSD leaves the first mode. If the MSD does not leave the first mode, the flow may return to the step S904. If the MSD leaves the first mode, in a step S907, the MSD is instructed to enter the second mode, and the flow returns to the step S901.

However, the various steps of FIG. 8 and FIG. 9 have been described in detail in the aforementioned introduction, so that details thereof are not repeated. It should be noted that the various steps of FIG. 8 and FIG. 9 may be implemented as a plurality of program codes or circuits, which is not limited by the disclosure. Moreover, the methods of FIG. 8 and FIG. 9 may be used in collaboration with the aforementioned exemplary embodiments, and may also be used independently, which is not limited by the disclosure.

In summary, in the first mode, the EI of the at least one operation event executed by the MSD is detected. According to the EI, a threshold value used for determining whether to instruct the MSD to enter the first mode may be adjusted. For example, after at least one adjustment to the threshold value, the threshold may be adjusted to an optimal customized value. Based on such customized value, the MSD may have a better balance between power saving and system performance.

The previously described exemplary embodiments of the present disclosure have the advantages aforementioned, wherein the advantages aforementioned not required in all versions of the disclosure.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A memory management method, adapted to a memory storage device comprising a memory control circuit unit and a rewritable non-volatile memory module, the memory management method comprising:

determining a first operation event among a plurality of operation events executed by the memory control circuit unit in a background mode as a successfully executed operation event if the first operation event is completed before the memory storage device leaves the background mode, wherein the operation events comprise at least one of a table read event, a data extraction event and a data write event performed to the rewritable non-volatile memory module;

determining a second operation event among the operation events executed by the memory control circuit unit in the background mode as a failed executed operation event if the second operation event is not completed before the memory storage device leaves the background mode;

obtaining a first total number of the successfully executed operation event, wherein in the background mode, the memory storage device executes a background operation corresponding to the operation events;

obtaining a second total number of the failed executed operation event;

obtaining a success rate calculated based on the first total number and the second total number;

adjusting a threshold value according to the success rate reflecting a proportion of the successfully executed operation events among all of the operation events performed by the memory control circuit unit in the background mode, and a power consumption of the memory storage device in the background mode is lower than a power consumption of the memory storage device in a normal mode; and counting time information in the normal mode, and instructing the memory storage device to enter the background mode to execute the background operation in response to the time information satisfying the threshold value, wherein adjusting the threshold value according to the success rate comprises:

increasing the threshold value by a first adjustment value in response to the success rate being smaller than a first evaluation value; and decreasing the threshold value by a second adjustment value in response to the success rate being greater than a second evaluation value, wherein the second evaluation value is greater than the first evaluation value.

2. The memory management method as claimed in claim 1, further comprising:
not to adjust the threshold value if the success rate is complied with a third condition.

3. The memory management method as claimed in claim 1, wherein the time information reflects an idle time of the memory storage device in the normal mode.

4. A memory storage device, comprising:
a connection interface unit, coupled to a host system;
a rewritable non-volatile memory module; and
a memory control circuit unit, coupled to the connection interface unit and the rewritable non-volatile memory module,
wherein the memory control circuit unit is configured to determine a first operation event among a plurality of operation events executed by the memory control circuit unit in a background mode as a successfully executed operation event if the first operation event is completed before the memory storage device leaves the background mode, wherein the operation events comprise at least one of a table read event, a data extraction event and a data write event performed to the rewritable non-volatile memory module,
the memory control circuit unit is further configured to determine a second operation event among the operation events executed by the memory control circuit unit in the background mode as a failed executed operation event if the second operation event is not completed before the memory storage device leaves the background mode,
the memory control circuit unit is further configured to obtain a first total number of the successfully executed operation event, obtain a second total number of the failed executed operation event, and obtain a success rate calculated based on the first total number and the second total number,
wherein in the background mode, the memory storage device executes a background operation corresponding to the operation events,
the memory control circuit unit is further configured to adjust a threshold value according to the success rate reflecting a proportion of the successfully executed operation events among all of the operation events performed by the memory control circuit unit in the background mode, and a power consumption of the memory storage device in the background mode is lower than a power consumption of the memory storage device in a normal mode, and
the memory control circuit unit is further configured to count time information in the normal mode, and instruct the memory storage device to enter the background mode to execute the background operation in response to the time information satisfying the threshold value,
wherein the operation that the memory control circuit unit adjusts the threshold value according to the success rate comprises:
increasing the threshold value by a first adjustment value in response to the success rate being smaller than a first evaluation value; and
decreasing the threshold value by a second adjustment value in response to the success rate being greater than a second evaluation value, wherein the second evaluation value is greater than the first evaluation value.

5. The memory storage device as claimed in claim 4, wherein the memory control circuit unit does not adjust the threshold value if the success rate is complied with a third condition.

6. The memory storage device as claimed in claim 4, wherein the time information reflects an idle time of the memory storage device in the normal mode.

7. A memory control circuit unit, adapted to control a memory storage device comprising a rewritable non-volatile memory module, the memory control circuit unit comprises:
a host interface, configured to be coupled to a host system;
a memory interface, configured to be coupled to the rewritable non-volatile memory module; and
a memory management circuit, coupled to the host interface and the memory interface,
wherein the memory management circuit is configured to determine a first operation event among a plurality of operation events executed by the memory control circuit unit in a background mode as a successfully executed operation event if the first operation event is completed before the memory storage device leaves the background mode, wherein the operation events comprise at least one of a table read event, a data extraction event and a data write event performed to the rewritable non-volatile memory module,
the memory management circuit is further configured to determine a second operation event among the operation events executed by the memory control circuit unit in the background mode as a failed executed operation event if the second operation event is not completed before the memory storage device leaves the background mode,
the memory management circuit is further configured to obtain a first total number of the successfully executed operation event, obtain a second total number of the failed executed operation event, and obtain a success rate calculated based on the first total number and the second total number,
wherein in the background mode, the memory storage device executes a background operation corresponding to the operation events,
the memory management circuit is further configured to adjust a threshold value according to the success rate reflecting a proportion of the successfully executed operation events among all of the operation events performed by the memory control circuit unit in the background mode, and a power consumption of the memory storage device in the background mode is lower than a power consumption of the memory storage device in a normal mode,
the memory management circuit is further configured to count time information in the normal mode, and instruct the memory storage device to enter the background mode to execute the background operation in response to the time information satisfying the threshold value,
wherein the operation that the memory management circuit adjusts the threshold value according to the success rate comprises:
increasing the threshold value by a first adjustment value in response to the success rate being smaller than a first evaluation value; and
decreasing the threshold value by a second adjustment value in response to the success rate being greater than a second evaluation value, wherein the second evaluation value is greater than the first evaluation value.

8. The memory control circuit unit as claimed in claim 7, wherein the memory management circuit does not adjust the threshold value if the success rate is complied with a third condition.

9. The memory control circuit unit as claimed in claim 7, wherein the time information reflects an idle time of the memory storage device in the normal mode.

* * * * *